Sept. 20, 1966 D. J. SIEBOLD 3,274,450

INSULATIVE SPACER FOR TELEVISION CHASSIS

Filed Feb. 19, 1965

INSULATIVE SPACER FOR TELEVISION CHASSIS

INVENTOR:
DONALD J. SIEBOLD,
BY William S. Wolfe
HIS ATTORNEY.

United States Patent Office 3,274,450

Patented Sept. 20, 1966

3,274,450

INSULATIVE SPACER FOR TELEVISION CHASSIS

Donald J. Siebold, North Syracuse, N.Y., assignor to General Electric Company, a corporation of New York Filed Feb. 19, 1965, Ser. No. 434,010
4 Claims. (Cl. 317—101)

Figures 1, 2, 3:
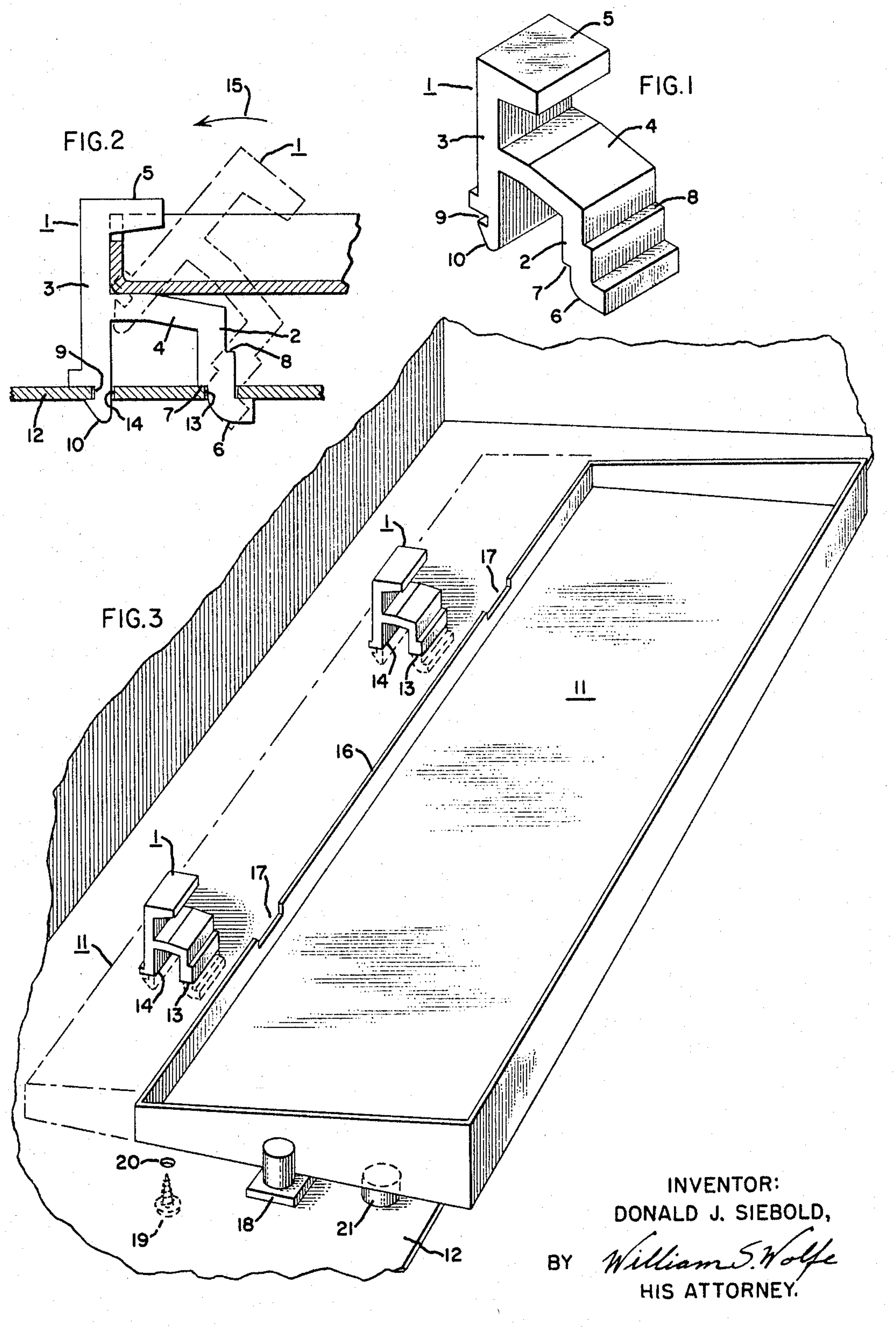

The present invention relates to insulative spacers and more specifically to an insulative spacer for use in electrically isolating a television receiver chassis from the receiver cabinet.

It is desirable in many applications to employ a television receiver chassis of the transformerless type. In such a transformerless chassis the metal chassis itself and other conductive elements electrically connected thereto are at the line potential. It is further desirable in many applications to employ a metal cabinet in conjunction with such a transformerless chassis. Accordingly, when utilizing a transformerless chassis in a metal cabinet it becomes imperative to electrically isolate the chassis from the cabinet in order to prevent the application of a dangerous voltage to the cabinet.

In the past, various insulative spacers have been employed to space the chassis from the cabinet to provide the necessary isolation. However, the prior art devices have in general exhibited various shortcomings. Thus, the prior art devices were often unduly complex and expensive and necessitated time consuming assembly operations. Further, many of the prior art insulative spacers performed a spacing function alone and did not aid in retaining the chassis in the desired position, the overall number of elements necessary to mount and properly isolate the chassis thus being multiplied. Yet further, the prior art devices did not provide for automatically aligning the chassis with respect to the cabinet so as to eliminate time consuming alignment procedures during fabrication.

The present invention presents an improved insulative spacer for a television receiver which completely overcomes the prior art problems.

Accordingly, an object of the invention is to provide an improved insulative spacer for a television receiver chassis.

Another object is to provide a simple and inexpensive insulative spacer for a television receiver chassis.

Yet another object is to provide an improved insulative spacer which in addition to providing the necessary isolation aids in retaining the chassis in the desired position.

A further object is to provide an improved insulative spacer for a television receiver chassis whereby the chassis is automatically aligned with respect to the receiver cabinet.

These and other objects are achieved in one embodiment of the invention through the use of an insulative spacer comprising first and second leg portions, the second leg portion being longer than the first. A first integral transverse portion joins the top of the first leg to an intermediate point of the second leg. A second integral transverse portion extends from the top of the second leg portion in a direction overlying the first transverse portion to define a channel therebetween. The channel is adapted to receive the upturned edge of a television receiver chassis, the chassis edge being slotted to receive the second transverse portion of the spacer and the chassis being retained thereby. The width of the spacer with respect to the slot is such that only limited lateral motion of the television receiver chassis is possible and thus automatic alignment is effected.

The bottom of each leg of the insulative spacer of the invention is so formed as to allow the spacer to be snapped into a pair of spaced apertures in the cabinet. Thus, the first leg is formed having a curved surface which is pivotally received by a first aperture, the spacer then being rotated to a position with the bottom of the second leg adjacent a second aperture. The bottom of the second aperture is so formed as to snap into the second aperture when a slight downward force is exerted on the spacer, the bottom of the second leg thus being received by the second aperture to lock the spacer to the cabinet.

The novel and distinctive features of the invention are set forth in the appended claims. The invention itself, together with further objects and advantages thereof, may best be understood by reference to the following description and accompanying drawings in which:

FIGURE 1 is a perspective view of the insulative spacer of the present invention, FIGURE 2 is a partial side view of the insulative spacer of the invention depicting the manner in which the chassis is isolated from the cabinet, and FIGURE 3 is an exploded perspective view of a television receiver employing the insulative spacers of the invention.

Referring to FIGURE 1 there is shown an insulative spacer 1 in accordance with the invention comprising a first leg portion 2 and a second leg portion 3, the second leg portion 3 being longer than the first leg portion 2. A first integral transverse portion 4 joins the top of the first leg portion 2 to an intermediate point of the second leg portion 3. A second integral transverse portion 5 extends from the top of the second leg portion 3 in a direction overlying the first transverse portion 4 thus defining a channel between the transverse portions 4 and 5.

The first leg portion 2 is provided with a curved portion 6 at the bottom thereof adapted to be pivotally received by an elongated aperture. The bottom of the first leg portion 2 is provided with a planar surface 7 which abuts the receiver cabinet when the curved portion 6 is positioned in a suitable aperture. The leg portion 2 can be further provided with a step 8 in order to maintain the desired material thickness in the curved portion 6.

The second leg portion 3 is provided with a slot 9 adapted to be received by a second aperture with a snap fit, the extremity 10 of the leg portion 3 being curved to facilitate insertion of the leg into the aperture.

The insulative spacer shown in FIGURE 1 is formed from an insulative material such as Cycolac-T and might advantageously be either injection molded or extruded.

Referring to FIGURE 2 there is shown the insulative spacer of FIGURE 1 as utilized to electrically isolate a chassis 11 from a metal cabinet 12. The insulative spacer 1 is inserted in first and second elongated apertures 13 and 14 in the cabinet 12 as follows. Initially, the curved portion 6 of the insulative spacer 1 is inserted in the aperture 13 with the insulative spacer 1 oriented as indicated by the dotted lines. Then, the insulative spacer 1 is rotated in the direction indicated by the arrow 15 to a position such that the curved portion 10 of leg 3 is adjacent the aperture 14. Finally, a slight downward force is exerted on the insulative spacer 1 so that the leg 3 is snapped into the aperture 14 and the slot 9 engages the cabinet 12. In this position the planar surface 7 abuts the cabinet 12 and the curved portion 6 of the leg portion 2 engages the undersurface of the cabinet 12 so that the insulative spacer is locked in place.

The transverse portions 4 and 5 define a channel which receive an upturned edge portion 16 of chassis 11, the edge portion 16 being slotted as more clearly shown in FIGURE 3 to receive the transverse portion 5. In this manner the channel defined by the transverse members 4 and 5 restrains vertical motion of the chassis 11 with respect to the cabinet 12.

Referring to FIGURE 3 there is shown an exploded perspective view of a television receiver employing a pair of insulative spacers 1 in accordance with the invention. The insulative spacers 1 are snapped into suitable apertures in the cabinet 12 as discussed above. The chassis 11, upon which are mounted various electrical components (not shown), is provided with slots 17 in upturned edge portion 16, the slots 16 receiving the transverse portion 5 of the associated insulative spacer. The chassis 11 is provided with an insulative foot 18 at each side thereof (a single such foot being shown in FIGURE 3), each foot 18 being adapted to receive a mounting screw 19 inserted through a suitable aperture 20 to rigidly mount the chassis to the cabinet. Thus, the use of the insulative spacers of the invention rigid mounting of the chassis is achieved through the use of but two mounting screws. An insulative pad 21 attached to the cabinet 12 may also be utilized to provide additional support for the rear of the chassis.

It will be appreciated that the chassis 11 is automatically aligned with respect to the cabinet 12 by sliding the chassis to a position indicated by the dotted lines in FIGURE 3 so that the transverse portion 5 of each insulative spacer 1 engages the associated slot 17. In this manner lateral movement of the chassis is prevented and the screws 19 can be easily inserted in the insulative foot 18 to rigidly mount the chassis to the cabinet. Thus, through the use of the insulative spacer of the invention automatic alignment is achieved and only a pair of screws 19 need be utilized to achieve a completely satisfactory mount.

Although the invention has been described with respect to certain specific embodiments, it will be appreciated that modifications and changes may be made by those skilled in the art without departing from the spirit and scope of the invention.

What is claimed as new and desired to be secured by Letters Patent of the United States:

1. In a television receiver having a cabinet structure and an internally located chassis, apparatus mounting said chassis in electrically insulated spaced relationship to said cabinet comprising;

(a) a plurality of insulative spacing members, each member including, (1) a first leg portion having a top and bottom thereof, said bottom of said first leg portion being pivotally received by a first aperture in said cabinet, (2) a second leg portion having a top and bottom thereof, said bottom of said second leg portion being received by a second aperture in said cabinet in locking engagement therewith, (3) a first integral transverse portion joining said top of said first leg portion to an intermediate point of said second leg portion, and (4) a second integral transverse portion extending from the top of said second leg portion and overlying said first transverse portion in spaced relationship therewith to define a channel receiving the edge of said chassis.

2. The apparatus defined in claim 1 wherein the chassis is provided with an upturned edge portion having at least one slot therein receiving the second transverse portion of one of said insulative spacing members.

3. The apparatus defined in claim 2 wherein means are provided on said chassis for attaching the chassis to the cabinet.

4. The apparatus defined in claim 3 wherein said means comprises first and second insulative feet attached to said chassis and first and second threaded members extending through first and second apertures in said cabinet and fixedly engaging said first and second feet respectively.

References Cited by the Examiner

UNITED STATES PATENTS

| | | | |
|---|---|---|---|
| 2,935,554 | 5/1960 | Steinke | 174—158 |
| 3,155,771 | 11/1964 | Steger et al. | 174—158 |
| 3,193,225 | 7/1965 | Terlinde | 248—223 |

FOREIGN PATENTS

| | | |
|---|---|---|
| 66,717 | 3/1957 | France. |

LARAMIE E. ASKIN, *Primary Examiner.*